(12) United States Patent
Suvarna

(10) Patent No.: US 9,947,789 B1
(45) Date of Patent: Apr. 17, 2018

(54) VERTICAL TRANSISTORS STRESSED FROM VARIOUS DIRECTIONS

(71) Applicant: GLOBALFOUNDRIES Inc., Grand Cayman (KY)

(72) Inventor: Puneet Harischandra Suvarna, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/295,338

(22) Filed: Oct. 17, 2016

(51) Int. Cl.
| | |
|---|---|
| H01L 21/02 | (2006.01) |
| H01L 29/78 | (2006.01) |
| H01L 29/786 | (2006.01) |
| H01L 27/092 | (2006.01) |
| H01L 29/66 | (2006.01) |
| H01L 29/423 | (2006.01) |
| H01L 21/8238 | (2006.01) |

(52) U.S. Cl.
CPC .. *H01L 29/7848* (2013.01); *H01L 21/823807* (2013.01); *H01L 21/823814* (2013.01); *H01L 21/823828* (2013.01); *H01L 21/823878* (2013.01); *H01L 21/823885* (2013.01); *H01L 27/092* (2013.01); *H01L 29/42392* (2013.01); *H01L 29/66545* (2013.01); *H01L 29/78618* (2013.01); *H01L 29/78642* (2013.01); *H01L 29/78684* (2013.01); *H01L 29/78696* (2013.01)

(58) Field of Classification Search
CPC ........... H01L 27/11273; H01L 29/7802; H01L 29/66712; H01L 29/7853–29/7854; H01L 29/16; H01L 29/167; H01L 29/201; H01L 29/205; H01L 29/207
See application file for complete search history.

(56) References Cited

U.S. PATENT DOCUMENTS

| | | | | |
|---|---|---|---|---|
| 5,561,302 | A * | 10/1996 | Candelaria | H01L 29/1054 257/190 |
| 9,614,077 | B1 * | 4/2017 | Cheng | H01L 29/7827 |
| 2008/0006908 | A1 * | 1/2008 | Lin | H01L 29/1054 257/619 |
| 2012/0086059 | A1 * | 4/2012 | Dubourdieu | H01L 21/28291 257/295 |
| 2012/0319211 | A1 * | 12/2012 | van Dal | H01L 29/66795 257/401 |
| 2012/0329228 | A1 * | 12/2012 | Yin | H01L 29/66537 438/285 |
| 2015/0243707 | A1 * | 8/2015 | Park | H01L 27/2454 257/2 |

(Continued)

*Primary Examiner* — Sonya D McCall Shepard
(74) *Attorney, Agent, or Firm* — Wayne F. Reinke, Esq.; Heslin Rothenberg Farley & Mesiti P.C.

(57) ABSTRACT

A vertical transistor includes a semiconductor substrate, and fin(s) over the semiconductor substrate (n-type fin(s) and/or p-type fin(s)), the fin(s) acting as vertical transistor channels for vertical transistors. Each of the fin(s) is lattice mismatched at one or more interface(s), being stressed from below, from above, from fin sidewalls or combination(s) thereof. The vertical transistors can be realized by providing a semiconductor substrate, forming stressed fin(s) of vertical transistor(s) acting as vertical transistor channels, the stressed fin(s) being lattice mismatched at one or more interfaces and being stressed from below, above, sidewalls or combination(s) thereof.

19 Claims, 6 Drawing Sheets

(56) References Cited

U.S. PATENT DOCUMENTS

| | | | |
|---|---|---|---|
| 2016/0190319 A1* | 6/2016 | Kavalieros | H01L 29/267 257/190 |
| 2016/0240616 A1* | 8/2016 | Cea | H01L 29/66431 |
| 2017/0213899 A1* | 7/2017 | Cheng | H01L 29/66666 |

* cited by examiner

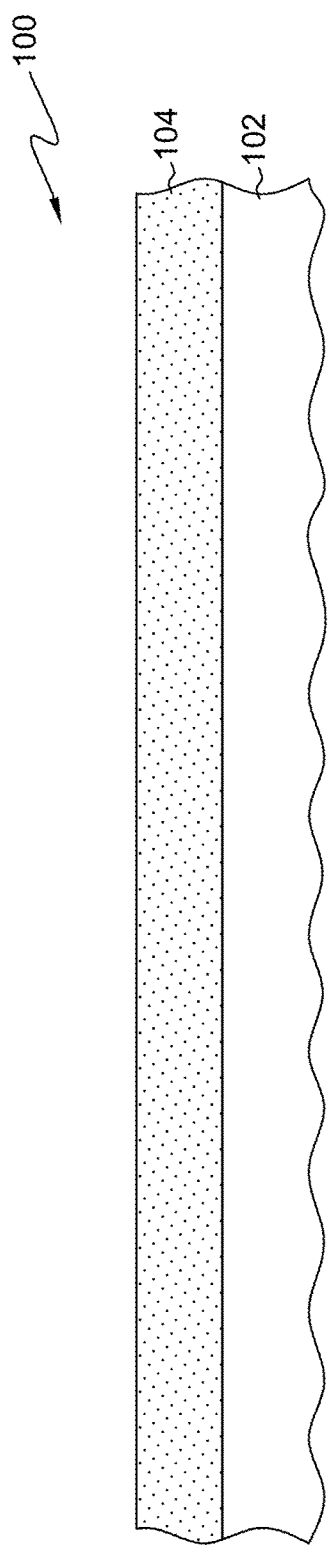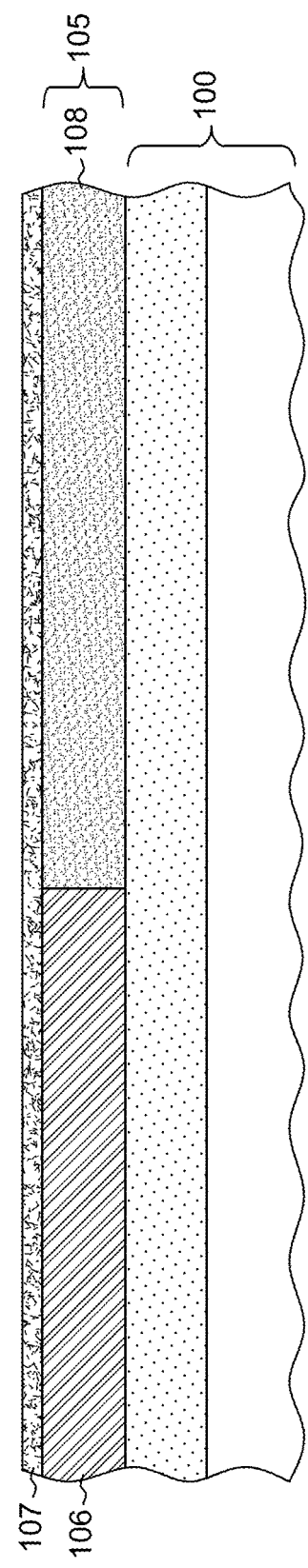

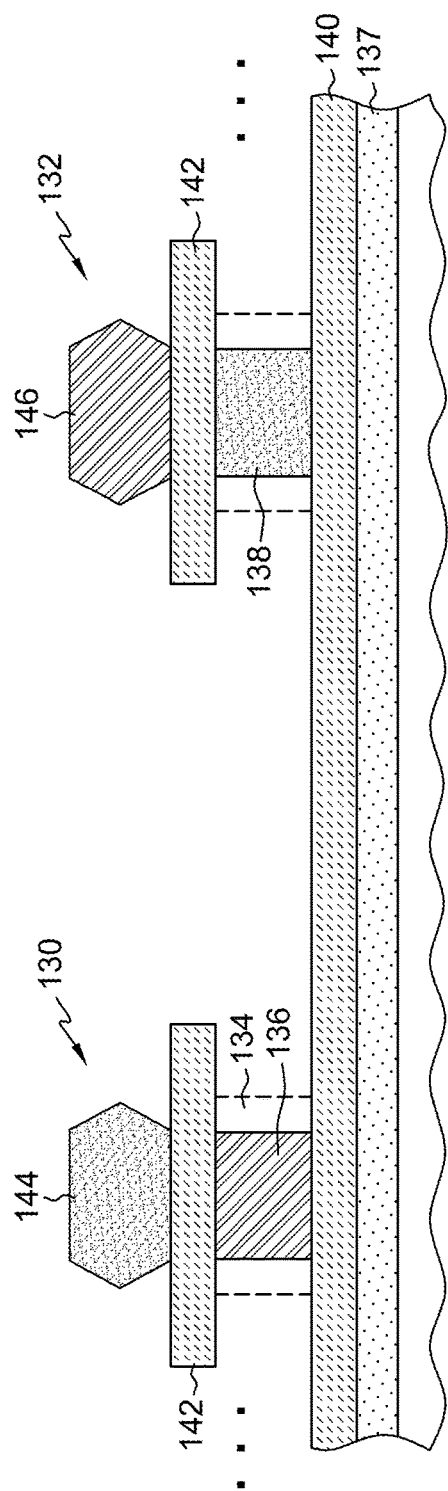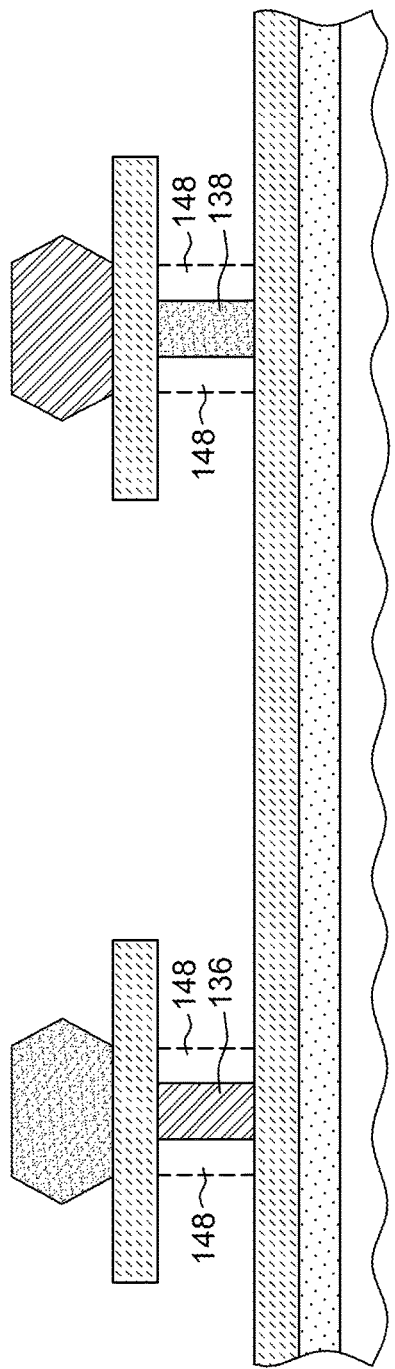

VERTICAL TRANSISTORS STRESSED FROM VARIOUS DIRECTIONS

BACKGROUND OF THE INVENTION

Technical Field

The present invention generally relates to vertical transistors (VFETs). More particularly, the present invention relates to stressing a vertical channel from various directions.

Background Information

In the past, much work has been done developing ways to stress horizontal channels in FETs. With VFETs, new ways to stress the vertical channel are needed.

SUMMARY OF THE INVENTION

Thus, a need exists for new ways to stress the vertical channel.

The shortcomings of the prior art are overcome and additional advantages are provided through the provision, in one aspect, of a semiconductor structure. The semiconductor structure includes a semiconductor substrate, at least one vertical channel over the semiconductor substrate, each of the at least one vertical channel in a form of a fin, for at least one vertical transistor, each vertical channel occupying an entirety of the fin, the at least one vertical channel being lattice mismatched at one or more interfaces, and the at least one vertical channel being stressed from at least one of below, above, and sidewalls thereof.

These, and other objects, features and advantages of this invention will become apparent from the following detailed description of the various aspects of the invention taken in conjunction with the accompanying drawings.

BRIEF DESCRIPTION OF THE DRAWINGS

FIG. 1 is a cross-sectional view of one example of a starting semiconductor structure for fabricating vertical transistors stressed from below, the starting semiconductor structure including a semiconductor substrate (e.g., silicon) and a strain-relaxed buffer layer thereover (e.g., silicon 80 germanium 20), in accordance with one or more aspects of the present invention.

FIG. 2 depicts one example of the starting semiconductor structure of FIG. 1 after forming an epitaxial fin layer, the epitaxial fin layer including a combination of a n-type epitaxial layer and a p-type epitaxial layer, and forming a hard mask layer over the fin layer, in accordance with one or more aspects of the present invention.

FIG. 7 depicts another example of stressing vertical transistor channels of n-type and p-type vertical transistors in a gate-last process after removing dummy gates from around the fins, the transistors situated on a strain-relaxed buffer layer, a bottom spacer layer over the strain-relaxed buffer layer, the structure also including n-type and p-type fins, respectively, a top spacer layer over the fins, and epitaxial semiconductor material appropriate for each of the n-type and p-type fins over the top spacer layer, in accordance with one or more aspects of the present invention.

FIG. 8 depicts one example of the structure of FIG. 7 after thinning of the fins in preparation for the epitaxial cladding formation, by removal of portions thereof, in accordance with one or more aspects of the present invention. In one example, the thinning may be accomplished using one or more etching processes.

DETAILED DESCRIPTION OF THE INVENTION

Figure 3:
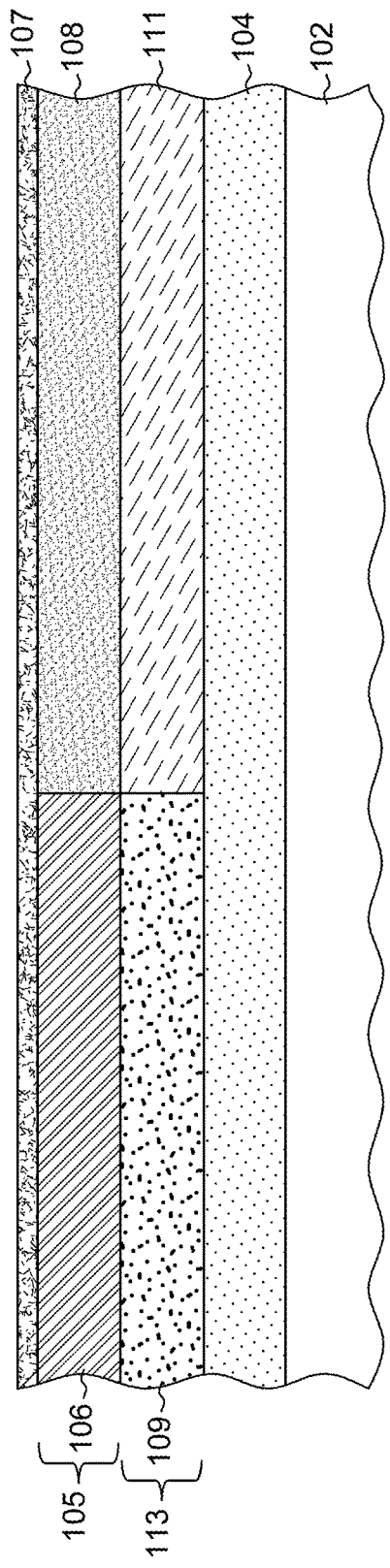
FIG. 3 depicts one example of the structure of FIG. 2 after optionally forming, prior to forming the epitaxial fin layer, a bottom source/drain layer, the bottom source/drain layer including a n-type source/drain portion and a p-type source/drain portion, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value.

Reference is made below to the drawings, which are not drawn to scale for ease of understanding, wherein the same reference numbers are used throughout different figures to designate the same or similar components.

The present invention provides various options for straining (compressive and/or tensile) the channel (i.e., fin) of a vertical transistor to improve performance. The strain may come from any one, any combination or all of from below the fin, from above the fin and/or from sidewalls of the fin. Such straining works, as described herein, with a gate-first and/or gate-last vertical transistor fabrication flow.

FIG. 1 is a cross-sectional view of one example of a starting semiconductor structure 100 for fabricating vertical transistors stressed from below, the starting semiconductor structure including a semiconductor substrate 102 (e.g., silicon) and a strain-relaxed buffer layer 104 thereover (e.g., silicon 80 germanium 20), in accordance with one or more aspects of the present invention.

The starting structure may be conventionally fabricated, for example, using known processes and techniques. However, although only a portion is shown for simplicity, it will be understood that, in practice, many such structures are typically included on the same substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

FIG. 2 depicts one example of the starting semiconductor structure of FIG. 1 after forming an epitaxial fin layer 105, the epitaxial fin layer including a combination of n-type epitaxial layer 106 and a p-type epitaxial layer 108, and forming a hard mask layer 107 over the fin layer, in accordance with one or more aspects of the present invention. In general, the amount of epitaxial germanium present in the n-type fins is higher than that of the strain-relaxed buffer layer, for example, at least about 10 percent more germanium, in order to produce compressive strain in the fin. The opposite is true for the p-type fins; that is, the germanium concentration of the p-type fins is at least about 10 percent less than the strain-relaxed buffer layer. In one example, the strain-relaxed buffer layer comprises epitaxial silicon germanium having about 20 percent germanium and about 80 percent silicon, the n-type fins comprise epitaxial silicon germanium of about 50 percent silicon and about 50 percent germanium, and the p-type fins comprise epitaxial silicon germanium with about zero percent germanium, i.e., just epitaxial silicon.

FIG. 3 depicts one example of the structure of FIG. 2 after optionally forming, prior to forming epitaxial fin layer 105, a bottom source/drain layer 113, the bottom source/drain layer including a n-type source/drain portion 109 and p-type source/drain portion 111. One skilled in the art will understand that this is merely one example of a bottom source/drain layer, and that more elements than mentioned herein go into a real-world VFET. Such elements, including a bottom source/drain layer, are otherwise omitted herein to focus on the channel straining aspects of the present invention.

Figure 4:
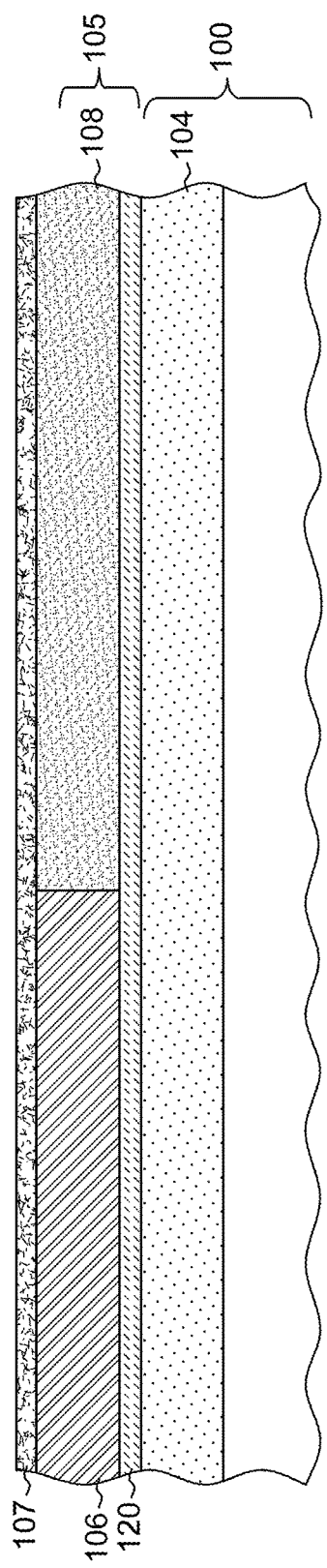
FIG. 4 depicts one example of the structure of FIG. 2 after optionally forming a spacer layer (e.g., a hard mask layer) over the strain-relaxed buffer layer (or, where the bottom source/drain layer is present, over the bottom source/drain layer) prior to epitaxial fin layer formation, in accordance with one or more aspects of the present invention.

FIG. 4 depicts one example of the structure of FIG. 2 after optionally forming a spacer layer 120 (e.g., a hard mask layer) over strain-relaxed buffer layer 104 (or, where bottom source/drain layer 113 is present, over the bottom source/drain layer) prior to epitaxial fin layer formation, in accordance with one or more aspects of the present invention. The presence of the bottom spacer prior to epitaxial cladding on the fins also prevents nucleation on the strain-relaxed buffer layer when the epitaxial cladding is formed on the fin sidewalls. Alternatively, the strain-relaxed buffer layer may be masked prior to formation of the epitaxial cladding on the fin sidewalls to prevent nucleation thereof from the epitaxial cladding formation.

Figure 5:
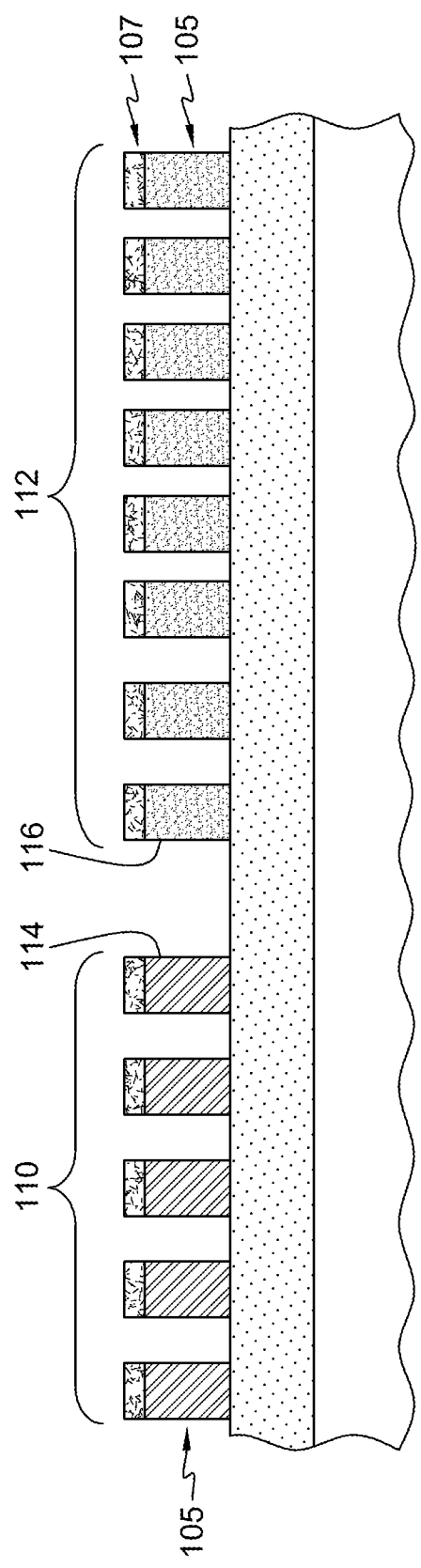
FIG. 5 depicts one example of the structure of FIG. 2 after patterning to remove portions of the fin layer to form n-type fins and p-type fins, in accordance with one or more aspects of the present invention.

FIG. 5 depicts one example of the structure of FIG. 2 after patterning to remove portions of fin layer 105 to form n-type fins 110 (e.g., n-type fin 114) and p-type fins 112 (e.g., p-type fin 116), in accordance with one or more aspects of the present invention.

Figure 6:
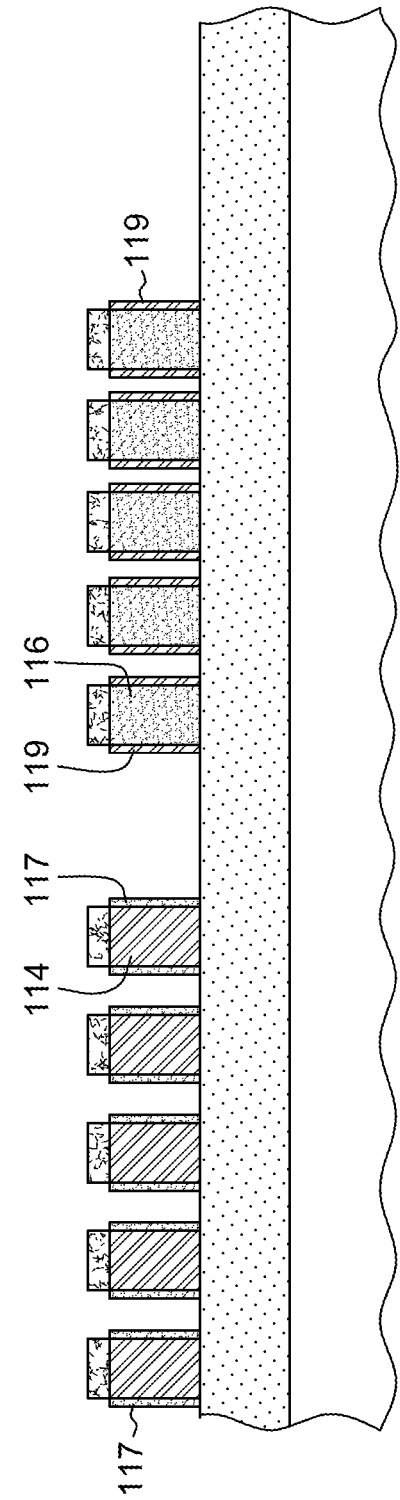
FIG. 6 depicts one example of the structure of FIG. 5 after forming epitaxial cladding material on sidewalls of the n-type fins and the p-type fins, respectively, in accordance with one or more aspects of the present invention.

FIG. 6 depicts one example of the structure of FIG. 5 after forming epitaxial cladding material 117, 119 on sidewalls of the n-type fins 114 and the p-type fins 116, respectively, in accordance with one or more aspects of the present invention. The hard mask layer on the fins may stay or be removed prior to the epitaxial cladding formation on sidewalls of the fins. Thus, FIG. 6 depicts straining the fins (i.e., the channels of the vertical transistors) with epitaxial cladding from sidewalls thereof. Note that forming the cladding on the fins just after fin formation will work with either a gate-first or gate-last process flow. A majority of conduction in the fin (channel) happens within about 1 nm to about 3 nm of the fin sidewalls, so vertical transistors can benefit from such cladding to add strain to the channel. In one example, the cladding has a thickness of about 1 nm to about 4 nm.

FIG. 7 depicts another example of stressing vertical transistor channels of n-type 130 and p-type 132 vertical transistors in a gate-last process after removing dummy gates (e.g., dummy gate 134) from around the fins, the transistors situated on a strain-relaxed buffer layer 137, a bottom spacer layer 140 over the strain-relaxed buffer layer, the structure also including n-type and p-type fins 136 and 138, respectively, a top spacer layer 142 over the fins, and epitaxial semiconductor material 144 and 146 appropriate for each of the n-type and p-type fins over the top spacer layer, in accordance with one or more aspects of the present invention. Although only one of each n-type and p-type vertical transistors are shown for simplicity, it will be understood that, typically, many more of each would be present on the same substrate.

As described above with respect to FIGS. 6 and 7, a composite fin channel according to the present invention may be achieved, for example, in one of two ways. The first way to achieve a composite fin channel fits into either a gate first or gate last flow just after patterning fins. The second way fits into a gate last approach at the start of the replacement gate process.

FIG. 8 depicts one example of the structure of FIG. 7 after thinning the fins in preparation for the epitaxial cladding formation, by removal of portions 148 of fins 136 and 138, in accordance with one or more aspects of the present invention. In one example, the thinning may be accomplished using one or more etching processes.

Figure 9:
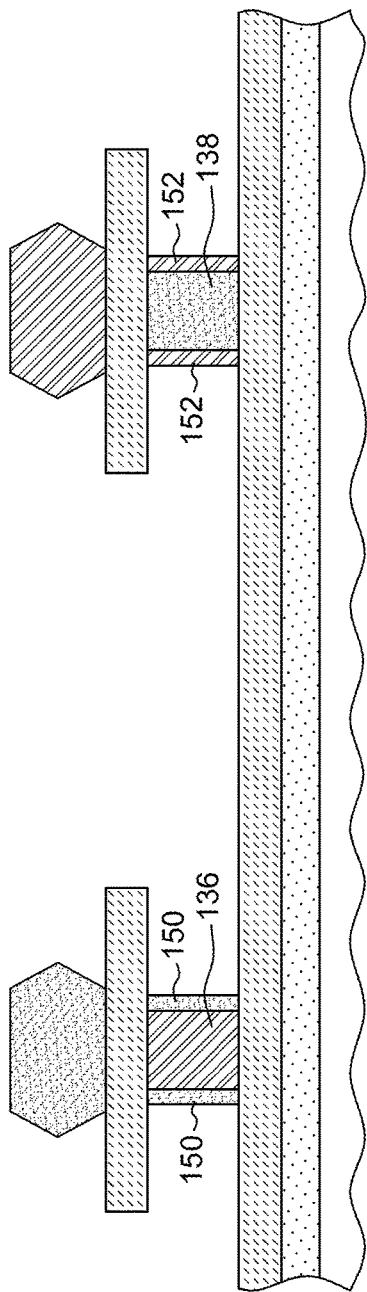
FIG. 9 depicts one example of the structure of FIG. 8 after forming n-type and p-type epitaxial semiconductor cladding layers around the thinned fins, respectively, in accordance with one or more aspects of the present invention.

FIG. 9 depicts one example of the structure of FIG. 8 after forming n-type 150 and p-type 152 epitaxial semiconductor cladding layers around the thinned fins 136 and 138, respectively, in accordance with one or more aspects of the present invention.

Figure 10:
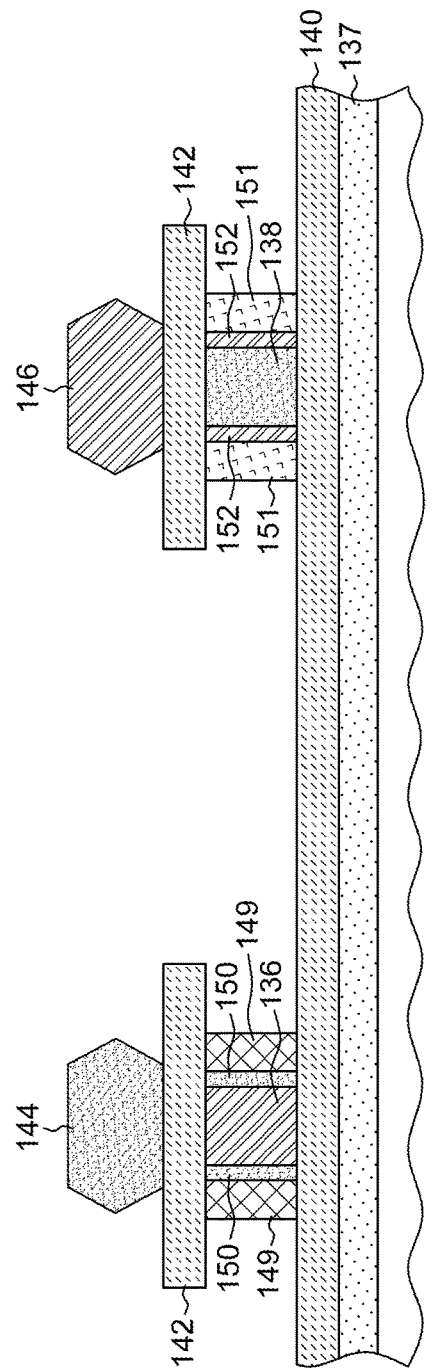
FIG. 10 depicts one example of the structure of FIG. 9 after forming wrap-around gates on the n-type and p-type vertical transistors, respectively, in accordance with one or more aspects of the present invention.

FIG. 10 depicts one example of the structure of FIG. 9 after forming wrap-around gates 149 and 151 on the n-type and p-type vertical transistors, respectively, in accordance with one or more aspects of the present invention.

In one example, where all three stressors are present and the vertical transistor is n-type, the top source/drain may include epitaxial silicon, the fin may include silicon germanium, the cladding layer may include epitaxial silicon, and the strain-relaxed buffer layer may include silicon germanium, the fin having a higher concentration of germanium than the strain-relaxed buffer layer. For example, the fin may include $Si_{50}Ge_{50}$, while the strain-relaxed buffer layer may include $Si_{80}Ge_{20}$.

In another example, where all three stressors are present and the vertical transistor is p-type, the top source/drain may include silicon germanium, the fin may include silicon, the cladding layer may include epitaxial silicon germanium, and the strain-relaxed buffer layer may include silicon germanium, the fin having a lower concentration of germanium than the strain-relaxed buffer layer. For example, the top source/drain may include silicon, while the strain-relaxed buffer layer may include $Si_{80}Ge_{20}$.

In one example, where all three stressors are present and the vertical transistor is n-type, the top source/drain may include epitaxial carbon-doped Si, the fin may include Ge, the cladding layer may include epitaxial Si, and the strain-relaxed buffer layer may include silicon germanium (e.g., $Si_{70}Ge_{30}$), the fin having a higher concentration of germanium than the strain-relaxed buffer layer. For example, the fin may include $Si_{80}Ge_{20}$, while the strain-relaxed buffer layer may include $Si_{80}Ge_{20}$.

In another example, where all three stressors are present and the vertical transistor is p-type, the top source/drain may include epitaxial-Ge, the fin may include carbon-doped Si, the cladding layer may include epitaxial silicon germanium (e.g., $Si_{80}Ge_{20}$), and the strain-relaxed buffer layer may include silicon germanium (e.g., $Si_{70}Ge_{30}$), the fin having a lower concentration of germanium than the strain-relaxed buffer layer. For example, the top source/drain may include silicon, while the strain-relaxed buffer layer may include silicon germanium (e.g., $Si_{80}Ge_{20}$.)

Figure 11:
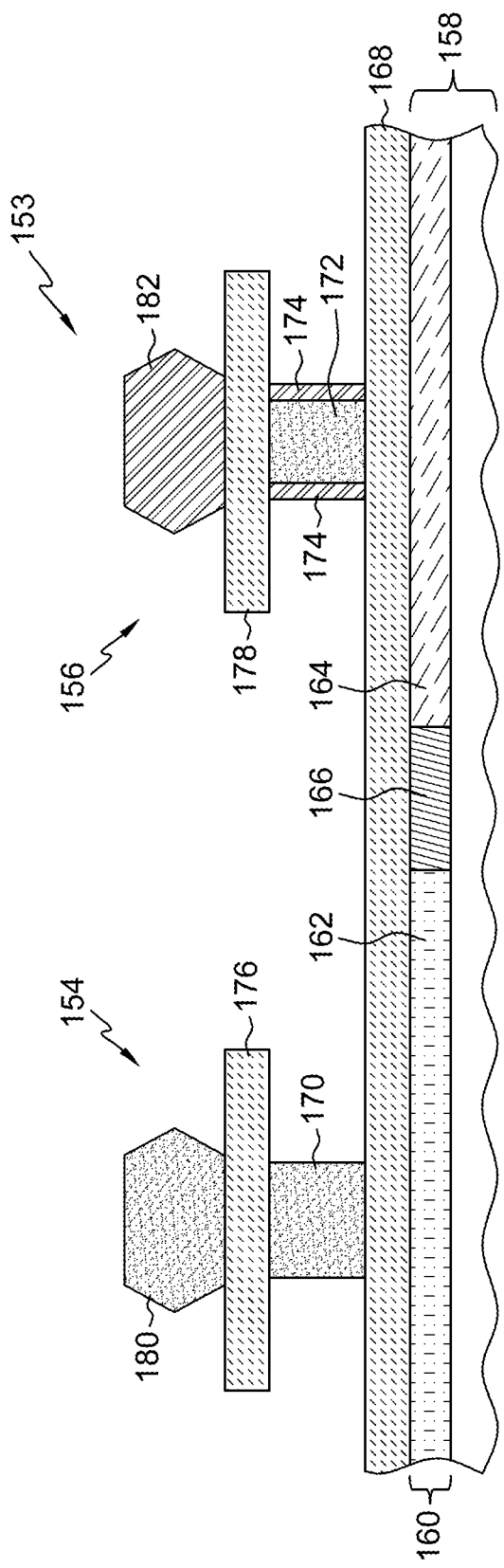
FIG. 11 depicts another example of a semiconductor structure including co-fabricated n-type and p-type vertical transistors, the semiconductor structure including a semiconductor substrate and a strain-relaxed buffer layer including n-type semiconductor material and p-type semiconductor material, the semiconductor materials of the strain-relaxed buffer layer being separated by an insulator material and acting as a bottom source/drain for the respective vertical transistors, a common bottom spacer layer, n-type fin (channel) and p-type fin (channel), the p-type fin surrounded by cladding material (gate), both the n-type fin and the p-type fin having a top spacer layer thereover, respectively, and n-type epitaxial material and p-type epitaxial material acting as a top drain/source for the respective vertical transistor, in accordance with one or more aspects of the present invention.

FIG. 11 depicts another example of a semiconductor structure 153 including co-fabricated n-type 154 and p-type 156 vertical transistors, the semiconductor structure including a strain-relaxed buffer layer including n-type semiconductor material 162 and p-type semiconductor material 164, the semiconductor materials of the strain-relaxed buffer layer 160 being separated by an insulator material 166 and acting as a bottom source/drain for the respective vertical transistors, a common bottom spacer layer 168, n-type fin 170 (channel) and p-type fin 172 (channel), the p-type fin surrounded by cladding material 174 (gate), both the n-type fin and the p-type fin having a top spacer layer 176, 178 thereover, respectively, and n-type epitaxial material 180 and p-type epitaxial material 182 acting as a top drain/source for the respective vertical transistor, in accordance with one or more aspects of the present invention.

In a first aspect, disclosed above is a semiconductor structure. The semiconductor structure includes a semiconductor substrate, fin(s) over the semiconductor substrate, the fin(s) acting as a vertical channel(s) for vertical transistor(s), The fin(s) is lattice mismatched at one or more interfaces, the fin(s) being stressed from at least one of below, above, and sidewalls thereof.

In one example, the semiconductor structure may further include, for example, a strain-relaxed buffer layer over the semiconductor substrate that is lattice mismatched with the fin(s) at an interface therebetween. In one example, the vertical transistor(s) may be, for example, n-type, and the fin(s) may include a higher germanium concentration than the strain-relaxed buffer layer. In one example, the fin(s) may include, for example, about 50 percent germanium and about 50 percent silicon, and the strain-relaxed buffer layer may include, for example, about 20 percent germanium and about 80 percent silicon.

In one example, the vertical transistor(s) with strain-relaxed buffer layer may be, for example, p-type, and the fin(s) may include a lower concentration of germanium than the strain-relaxed buffer layer. In one example, the strain-relaxed buffer layer may include about 20 percent germanium and about 80 percent silicon.

In one example, the semiconductor structure of the first aspect may further include, for example, a top source/drain layer(s) over the fin(s) that is lattice mismatched with the fin(s) at an interface therebetween. In one example, the vertical transistor(s) may be, for example, n-type, the top source/drain layer(s) may include epitaxial silicon, and the fin(s) may include silicon germanium having about 50 percent germanium and about 50 percent silicon. In another example, the vertical transistor(s) may be, for example, p-type, the top source/drain layer(s) may include epitaxial silicon germanium having about 50 percent germanium and about 50 percent silicon, and the fin(s) may include silicon.

In one example, where the top source/drain layer(s) are present, the vertical transistor(s) may be, for example, n-type, the top source/drain layer(s) may include epitaxial carbon-doped silicon, and the fin(s) may include germanium.

In one example, where the top source/drain layer(s) are present, the vertical transistor(s) may be, for example, p-type, the top source/drain layer(s) may include epitaxial germanium, and the fin(s) may include carbon-doped silicon.

In one example, the semiconductor structure of the first aspect may further include, for example, semiconductor cladding layer(s) surrounding the fin(s) that is lattice mismatched with the fin(s) at an interface therebetween, i.e., at sidewalls of the fin(s). In one example, the semiconductor cladding layer may have, for example, a thickness of about 1 nm to about 4 nm.

In one example, the vertical transistor(s) may be, for example, p-type, the semiconductor cladding layer may include epitaxial silicon germanium, and the semiconductor cladding layer may include a higher concentration of germanium than the fin(s).

In one example, the vertical transistor(s) may be, for example, n-type, the semiconductor cladding layer may include epitaxial silicon, the fin(s) may include silicon germanium, and the semiconductor cladding layer may be lattice mismatched with the fin(s) at an interface therebetween.

In one example, the vertical transistor(s) may be, for example, n-type, the semiconductor cladding layer may include epitaxial silicon germanium of a lower concentration of germanium than the fin(s).

In one example, the vertical transistor(s) may be, for example, p-type, the semiconductor cladding layer may include epitaxial silicon germanium having about 50 percent silicon and about 50 percent germanium, and the fin(s) may include carbon-doped silicon.

In one example, the semiconductor structure of the first aspect may further include, for example, a strain-relaxed buffer layer over the semiconductor substrate that is lattice mismatched with the fin(s) at an interface therebetween, top source/drain layer(s) over the fin(s) that is lattice mismatched with the fin(s) at an interface therebetween, and at least one semiconductor cladding layer surrounding the at least one fin that is lattice mismatched with the fin(s) at an interface therebetween.

In one example, the vertical transistor(s) may be, for example, n-type, the top source/drain layer(s) and the semiconductor cladding layer(s) may include epitaxial silicon, the fin(s) may include silicon germanium having about 50 percent silicon and about 50 percent germanium, and the strain-relaxed buffer layer may include silicon germanium having about 80 percent silicon and about 20 percent germanium.

In one example, the vertical transistor(s) may be, for example, p-type, the top source/drain layer(s) may include silicon germanium having about 50 percent silicon and 50 percent germanium, the fin(s) may include silicon, the semiconductor cladding layer(s) may include epitaxial silicon germanium having about 50 percent silicon and about 50 percent germanium, and the strain-relaxed buffer layer may include about 80 percent silicon and about 20 percent germanium.

In one example, the vertical transistor(s) may be, for example, n-type, the top source/drain layer(s) may include epitaxial germanium, the fin(s) may include carbon-doped silicon, the semiconductor cladding layer(s) may include epitaxial silicon germanium, and the strain-relaxed buffer layer may include silicon germanium of a higher silicon concentration than the semiconductor cladding layer.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A semiconductor structure, comprising:
   a semiconductor substrate;
   at least one vertical channel over the semiconductor substrate, each of the at least one vertical channel in a form of a fin, for at least one vertical transistor, wherein each vertical channel occupies an entirety of the fin;
   wherein the at least one vertical channel is lattice mismatched at one or more interfaces, the at least one vertical channel being stressed from at least one of below, above, and sidewalls thereof;
   at least one semiconductor cladding layer surrounding the at least one fin that is lattice mismatched with the at least one vertical channel at an interface therebetween; and
   wherein the at least one vertical transistor is n-type, wherein the semiconductor cladding layer comprises epitaxial silicon germanium of a lower concentration of germanium than the at least one vertical channel.

2. The semiconductor structure of claim 1, further comprising a strain-relaxed buffer layer over the semiconductor substrate that is lattice mismatched with the at least one vertical channel at an interface therebetween.

3. The semiconductor structure of claim 1, further comprising at least one top source/drain layer over the at least one vertical channel that is lattice mismatched with the at least one vertical channel at an interface therebetween.

4. The semiconductor structure of claim 1, wherein the semiconductor cladding layer has a thickness of about 1 nm to about 4 nm.

5. The semiconductor structure of claim 1, further comprising:
   a strain-relaxed buffer layer over the semiconductor substrate that is lattice mismatched with the at least one vertical channel at an interface therebetween; and
   at least one top source/drain layer over the at least one fin that is lattice mismatched with the at least one vertical channel at an interface therebetween.

6. The semiconductor structure of claim 2, wherein the at least one vertical transistor is n-type, and wherein the at least one vertical channel comprises a higher germanium concentration than the strain-relaxed buffer layer.

7. The semiconductor structure of claim 3, wherein the at least one vertical transistor is n-type, wherein the at least one top source/drain layer comprises epitaxial silicon, and wherein the at least one vertical channel comprises silicon germanium having about 50 percent germanium and about 50 percent silicon.

8. The semiconductor structure of claim 3, wherein the at least one top source/drain layer comprises epitaxial carbon-doped silicon, and wherein the at least one vertical channel comprises germanium.

9. The semiconductor structure of claim 6, wherein the at least one vertical channel comprises about 50 percent germanium and about 50 percent silicon, and wherein the strain-relaxed buffer layer comprises about 20 percent germanium and about 80 percent silicon.

10. A semiconductor structure, comprising:
a semiconductor substrate;
at least one vertical channel over the semiconductor substrate, each of the at least one vertical channel in a form of a fin, for at least one vertical transistor, wherein each vertical channel occupies an entirety of the fin;
wherein the at least one vertical channel is lattice mismatched at one or more interfaces, the at least one vertical channel being stressed from at least one of below, above, and sidewalls thereof;
at least one semiconductor cladding layer surrounding the at least one fin that is lattice mismatched with the at least one vertical channel at an interface therebetween; and
wherein the at least one vertical transistor is n-type, wherein the semiconductor cladding layer comprises epitaxial silicon, wherein the at least one vertical channel comprises silicon germanium, and wherein the semiconductor cladding layer is lattice mismatched to the at least one vertical channel at an interface therebetween.

11. The semiconductor structure of claim 10, further comprising a strain-relaxed buffer layer over the semiconductor substrate that is lattice mismatched with the at least one vertical channel at an interface therebetween.

12. The semiconductor structure of claim 10, further comprising at least one top source/drain layer over the at least one vertical channel that is lattice mismatched with the at least one vertical channel at an interface therebetween.

13. The semiconductor structure of claim 10, wherein the semiconductor cladding layer has a thickness of about 1 nm to about 4 nm.

14. The semiconductor structure of claim 10, further comprising:
a strain-relaxed buffer layer over the semiconductor substrate that is lattice mismatched with the at least one vertical channel at an interface therebetween; and
at least one top source/drain layer over the at least one fin that is lattice mismatched with the at least one vertical channel at an interface therebetween.

15. The semiconductor structure of claim 11, wherein the at least one vertical transistor is n-type, and wherein the at least one vertical channel comprises a higher germanium concentration than the strain-relaxed buffer layer.

16. The semiconductor structure of claim 12, wherein the at least one vertical transistor is n-type, wherein the at least one top source/drain layer comprises epitaxial silicon, and wherein the at least one vertical channel comprises silicon germanium having about 50 percent germanium and about 50 percent silicon.

17. The semiconductor structure of claim 12, wherein the at least one top source/drain layer comprises epitaxial carbon-doped silicon, and wherein the at least one vertical channel comprises germanium.

18. The semiconductor structure of claim 15, wherein the at least one vertical channel comprises about 50 percent germanium and about 50 percent silicon, and wherein the strain-relaxed buffer layer comprises about 20 percent germanium and about 80 percent silicon.

19. A semiconductor structure, comprising:
a semiconductor substrate;
at least one vertical channel over the semiconductor substrate, each of the at least one vertical channel in a form of a fin, for at least one vertical transistor, wherein each vertical channel occupies an entirety of the fin;
wherein the at least one vertical channel is lattice mismatched at one or more interfaces, the at least one vertical channel being stressed from at least one of below, above, and sidewalls thereof;
a strain-relaxed buffer layer over the semiconductor substrate that is lattice mismatched with the at least one vertical channel at an interface therebetween;
at least one top source/drain layer over the at least one fin that is lattice mismatched with the at least one vertical channel at an interface therebetween;
at least one semiconductor cladding layer surrounding the at least one vertical channel that is lattice mismatched with the at least one vertical channel at an interface therebetween; and
wherein the at least one vertical transistor comprises at least one n-type vertical transistor and at least one p-type vertical transistor, wherein for the at least one n-type vertical transistor, the at least one top source/drain layer and the semiconductor cladding layer comprise epitaxial silicon, wherein the at least one vertical channel comprises silicon germanium having about 50 percent silicon and about 50 percent germanium, and wherein the strain-relaxed buffer layer comprises silicon germanium having about 80 percent silicon and about 20 percent germanium, wherein for the at least one p-type vertical transistor, the at least one top source/drain layer comprises silicon germanium having about 50 percent silicon and 50 percent germanium, wherein the at least one vertical channel comprises silicon, wherein the at least one semiconductor cladding layer comprises epitaxial silicon germanium having about 50 percent silicon and about 50 percent germanium, and wherein the strain-relaxed buffer layer comprises about 80 percent silicon and about 20 percent germanium.

* * * * *